United States Patent [19]

d'Aragona

[11] Patent Number: 4,545,849
[45] Date of Patent: Oct. 8, 1985

[54] METHOD FOR CONTROL OF OXYGEN IN SILICON CRYSTALS

[75] Inventor: F. Secco d'Aragona, Scottsdale, Ariz.

[73] Assignee: Motorola Inc., Schaumburg, Ill.

[21] Appl. No.: 471,585

[22] Filed: Mar. 3, 1983

[51] Int. Cl.⁴ .............................................. C30B 15/00
[52] U.S. Cl. .............................................. 156/617 SP
[58] Field of Search ......... 156/617 SP, 601, DIG. 66, 156/DIG. 83; 422/249

[56] References Cited

U.S. PATENT DOCUMENTS

| 4,040,895 | 8/1977 | Patrick et al. | 422/249 |
| 4,352,784 | 10/1982 | Lin | 156/DIG. 83 |
| 4,400,232 | 8/1983 | Ownby et al. | 156/DIG. 83 |
| 4,436,577 | 3/1984 | Frederick | 156/617 SP |

FOREIGN PATENT DOCUMENTS

| 2312816 | 1/1977 | France | 156/DIG. 83 |
| 155733 | 6/1982 | Netherlands | 156/617 SP |

Primary Examiner—Hiram H. Bernstein
Attorney, Agent, or Firm—John A. Fisher

[57] ABSTRACT

An improved process is disclosed for controlling the oxygen content of a Czochralski grown silicon crystal pulled from a silicon melt contained in a silica crucible. High, uniform oxygen concentrations are achieved by attaching an additional piece of silica to the inside of the crucible bottom. Preferably the additional silica is formed from a silica rod bent to a toroid shape. The toroid has about the diameter of the crystal being pulled and is located substantially coaxial with the growing crystal.

3 Claims, 4 Drawing Figures

METHOD FOR CONTROL OF OXYGEN IN SILICON CRYSTALS

BACKGROUND OF THE INVENTION

This invention relates in general to a method for growing silicon crystals, and more particularly to a method for growing silicon crystals having a uniform and predetermined concentration of oxygen.

Most of the silicon used in the semiconductor industry is produced in single crystal form by the Czochralski technique. In this technique a quantity of pure silicon is melted in a silica crucible, a seed crystal is dipped into the silicon melt and then controllably withdrawn to pull a single crystal ingot from the melt. The silicon charge is usually very pure silicon to which controlled amounts of dopant have been added to yield a crystal having the desired conductivity type and resistivity.

Oxygen is an unintentional dopant impurity in Czochralski grown silicon crystals which results from the dissolution of the silica crucible used to contain the silicon melt. During the crystal pulling process oxygen enters the silicon lattice where it occupies an interstitial position. Interstitial oxygen in silicon can be either detrimental or beneficial depending upon the intended use of the silicon. One important beneficial result, in certain applications, is intrinsic gettering which results from a high interstitial oxygen concentration. To accomplish intrinsic gettering the oxygen concentration in the grown silicon is carefully controlled within a critical range, greater than about $1.6 \times 10^{18}$ cm$^{-3}$. During the subsequent processing of a silicon substrate, that oxygen is caused to precipitate in the bulk of the substrate while at the same time it is depleted by outdiffusion at the substrate surface. This results in a region of oxygen defects in the bulk of the substrate and a zone denuded of defects at the surface. During successive steps at elevated temperatures the oxygen precipitates attract highly mobile and usually electrically active metal contaminants away from the active device area at the substrate surface. The contaminants are immobilized at the oxygen precipitates leaving a low contaminant, high lifetime surface zone.

Unfortunately, the practice of intrinsic gettering is made difficult by the fact that oxygen is not uniformly distributed throughout a silicon ingot. Ingots grown by the Czochralski technique are typically characterized by an axial oxygen concentration distribution which is high at the seed end, increases still further within the first few centimeters of crystal, decreases gradually through most of the crystal and then rises again at the tang end. If the typical Czochralski ingot is sawed into a plurality of wafers, some of the wafers from that ingot will have the desired oxygen concentration for intrinsic gettering and others will not. To use these wafers in an intrinsic gettering application would therefore require that each wafer be characterized and sorted according to oxygen concentration. The result is an expensive and time consuming sorting operation and a low overall yield.

There is, therefore, a need for silicon wafers having a uniform oxygen concentration in a particular concentration range which cannot reproducibly be supplied by prior art techniques.

It is therefore an object of this invention to provide an improved process for the growth of silicon crystals.

It is another object of this invention to provide an improved process for the growth of silicon crystals having a uniform oxygen concentration.

It is yet another object of this invention to provide an improved process for the growth of high oxygen concentration silicon crystals.

It is still another object of this invention to provide an improved silica crucible for use in the pulling of a silicon crystal.

It is still another object of this invention to provide an improved process for growing silicon crystals having a uniform concentration of oxygen in a predetermined range.

BRIEF SUMMARY OF THE INVENTION

The foregoing and other objects and advantages of the invention are achieved through an improved process which utilizes an improved silica crucible. According to one embodiment of the invention a silicon crystal is pulled from a melt contained in a silica crucible. Attached to the inner surface of the crucible bottom is an additional piece of silica. Preferably, the additional piece of silica is toroidal shaped with the toroid approximately the same diameter as and coaxial with the growing silicon crystal.

DETAILED DESCRIPTION OF PREFERRED EMBODIMENTS

The Czochralski technique for pulling crystals is well known and, accordingly, details of that technique will not be enumerated herein. In general, a quantity of pure polycrystalline silicon is melted in a silica crucible; a small amount of dopant material may also be added to the melt to control the conductivity type and resistivity. For a 75 mm diameter crystal ingot, the melt size is about 4–8 kg. For a 100 mm diameter crystal ingot, the melt size is about 20–25 kg. The silica crucible has a diameter of about 20–30 cm. Typical growth conditions include a pressure within the crystal pulling reactor of about 2700 Pa, a crystal rotation of about 14–18 rpm, and a crucible rotation of about 8–12 rpm. The above noted parameters are typical parameters and are given for illustration only; it is not intended that the invention be limited to these illustrative values.

Figure 1:
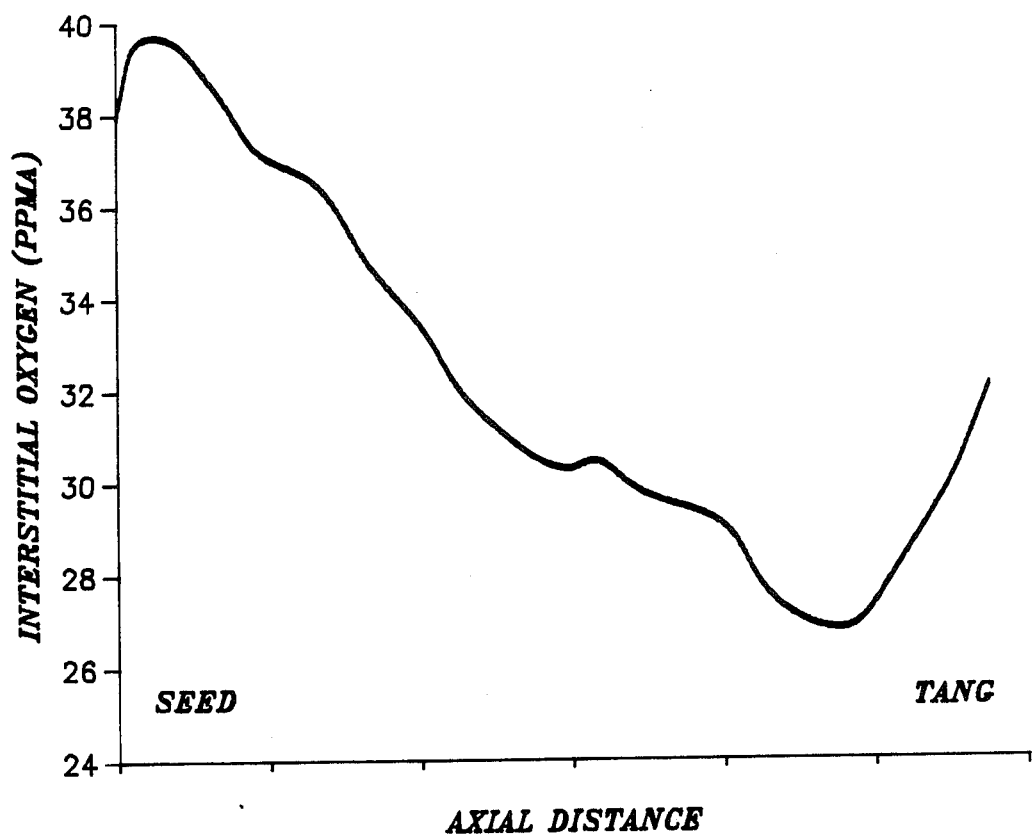
FIG. 1 illustrates graphically the axial distribution of interstitial oxygen incorporated in a silicon crystal grown by the conventional Czochralski process.

FIG. 1 illustrates the interstitial oxygen concentration $[O_i]$ for a crystal ingot grown by the conventional Czochralski crystal pulling technique. The $[O_i]$ concentration, in ppma is plotted against the crystal length. The interstitial oxygen concentration is measured, for example, either by double beam IR absorption or by Fourier transform technique. Absorption bands are taken at the 9 $\mu$ band which corresponds to the vibrational energy of interstitial oxygen in silicon. The measure of absorption coefficient is then converted to concentration or ppma. The results shown in FIG. 1 illustrate a rise in oxygen concentration over the first few centimeters of crystal as measured from the seed end followed by a gradual decrease in concentration over the major length of the crystal, and then a rise in concentration near the tang end. From the curve it is evident that the only way to obtain a true characterization of the oxygen concentration is by sampling the concentration along the entire length of the ingot. Merely sampling and comparing the oxygen concentration at the seed and tang ends does not reveal the significant dip in concentration along the length.

Figure 2:
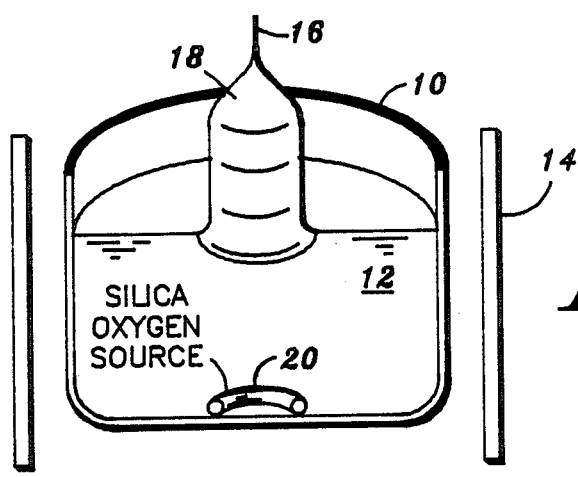
FIG. 2 illustrates apparatus for practice of the invention.

In accordance with the invention, the conventional Czochralski crystal pulling technique is modified to make the interstitial oxygen concentration more uniform along the length of the crystal. Preferably the oxygen concentration has a high, uniform value greater than about $1.6 \times 10^{18}$ cm$^{-3}$ (about 32 ppma) FIG. 2 schematically illustrates modified apparatus for pulling crystals in accordance with the invention. The apparatus includes a silica crucible 10 which contains a silicon melt 12. The melt is heated by heaters 14 which can be, for example, graphite resistance heaters. In the practice of the invention, a seed crystal 16 is dipped into the melt and then controllably withdrawn from the melt to pull a single crystal silicon ingot 18. Means for pulling the crystal, rotating the crystal, rotating the crucible, and controlling the ambient and pressure about the apparatus are conventional in the crystal growing art and have not been shown in this illustration. In accordance with the invention, an additional piece of silica 20 is affixed to the interior surface of the bottom of the crucible. Preferably, the additional piece of silica is toroidal shaped, has about the same diameter as does the crystal being pulled, and is positioned on the bottom of the crucible, submerged in the melt, to be substantially coaxial with the growing crystal.

The additional silica can be provided, for example, in the form of a silica rod about 1 cm in diameter and bent to the desired shape. The 1 cm diameter rod is not of sufficient height to interfere with ingot growth. Fire polishing of the rod is desirable to minimize chipping of the ring during the initial meltdown of the silicon charge. Additionally, when loading the crucible it is advantageous to first load some small pieces of polycrystalline silicon at the bottom to avoid chipping of the added silica. Any silica chips which break off will float to the surface of the melt and can interfere with proper crystal pulling.

Figure 3:
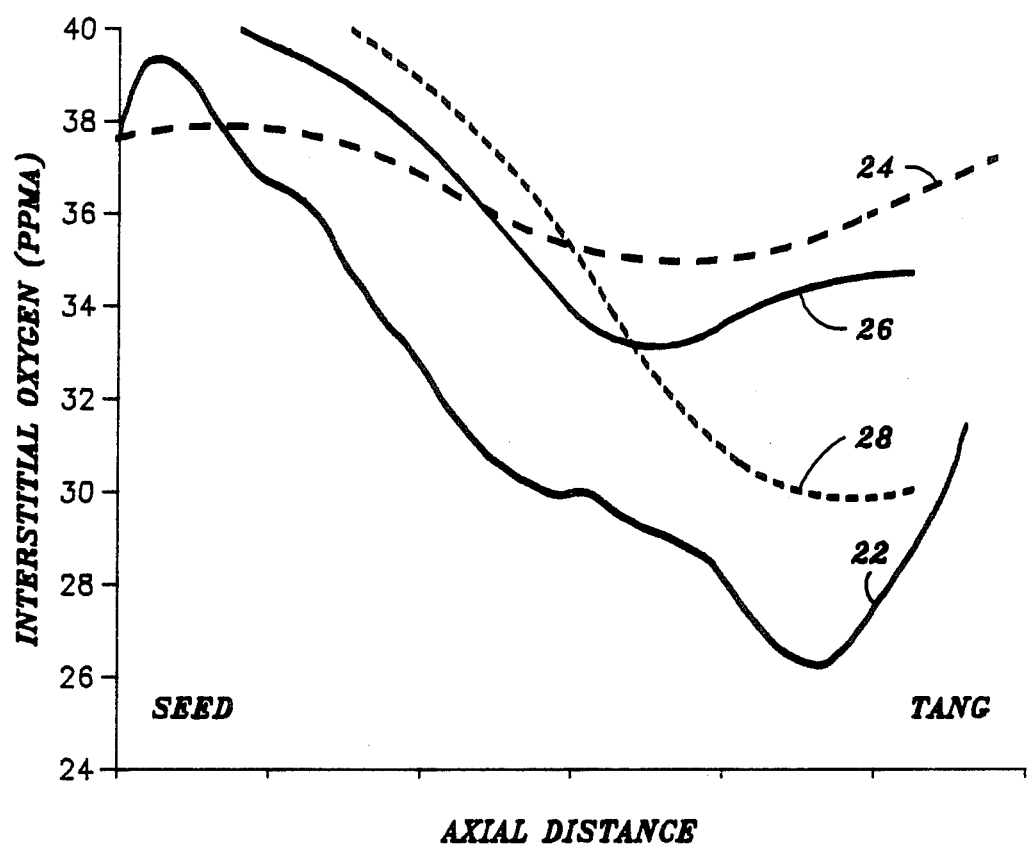
FIG. 3 illustrates graphically axial distribution of interstitial oxygen incorporated in a silicon crystal grown by various embodiments in accordance with the invention.

FIG. 3 illustrates the actual distribution of interstitial oxygen as a function of the shape of the additional silica added to the crucible, in accordance with the invention. As a comparison, the results of FIG. 1 for the conventional Czochralski technique are replotted in FIG. 3 as curve 22. The best results are achieved, i.e., the flattest distribution of high concentration interstitial oxygen along the entire length of the crystal, with a toroidal ring (curve 24) positioned coaxially with the growing crystal. The distribution of interstitial oxygen is also leveled, to a lesser extent, by the addition of additional silica in the crucible bottom in the shape of a cross (curve 26) or a square (curve 28). The less than optimum results achieved with the additional silica in the form of a square illustrates that best results are achieved when the additional silica is placed directly beneath the growing crystal. In each of these instances the additional silica is attached to the interior of the bottom of the silica crucible.

Figure 4:
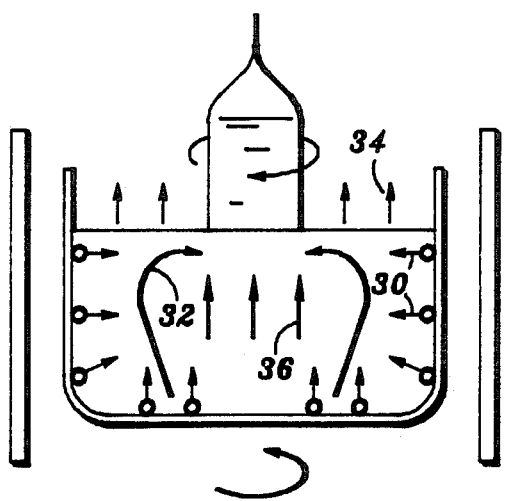
FIG. 4 illustrates the relationship between oxygen controlling functions occurring within the crystal growing apparatus.

While the inventor does not wish to be bound by any particular theory of operation, nor should the invention be limited by any such theory, it is believed that the results achieved from a process in accordance with the invention may be explained in the following way. It is known that the silica crucible used to contain the melt dissolves in the molten silicon to form silicon monoxide, SiO. The mechanism for the incorporation of the SiO into the silicon crystal can be understood phenomenologically with reference to FIG. 4 which illustrates the movement of the relevant materials in and from the silicon melt. See, for example, the discussion by Benson et al., Semiconductor Silicon 1981, p. 33, Huff et al. Eds., Electrochemical Society, N.J. 1981. Following crucible dissolution 30, the oxygen rich melt near the crucible walls is driven upward by thermal convection 32. At the surface of the silicon melt a large portion of the SiO escapes from the melt by evaporation 34. A countervailing force 36 which results from forced convection due to the crystal rotation drives the oxygen to the growing crystal interface. The amount of oxygen incorporated into the silicon crystal is therefore influenced by at least the following parameters: crucible dissolution which is, in turn, dependent on the melt height; evaporation from the melt; forced convection; and thermal convection. As the silicon melt level in the crucible decreases, there is less crucible area contributing to dissolution, but the evaporation rate remains approximately constant. This results in less oxygen available to reach the crystal interface and the amount of oxygen incorporated into the growing crystal decreases along the length of the crystal. Additionally, both thermal convection and forced convection become less important in a low melt situation thus contributing to less oxygen incorporation. Flattening of the oxygen concentration profile and achieving a uniform, high oxygen concentration, in accordance with the invention, therefore apparently results from adding an additional oxygen source, and specifically from adding the oxygen source in a location beneath the growing crystal where forced convection maximizes the effect of this additional source while having a minimal effect on the evaporation rate.

Thus it is apparent that there has been provided, in accordance with the invention, an improved crystal growing process which fully achieves the objects and advantages set forth above. While the invention has been explained and illustrated with reference to specific embodiments thereof, it is not intended that the invention be limited to these embodiments. Those skilled in the art, after review of the foregoing description, will appreciate that variations and modifications in the exemplary embodiments are possible without deviating from the spirit and scope of the invention. Such modifications and variations include, for example, other shapes, sizes and sources for the additional silica. Accordingly, it is intended that all such variations and modifications that fall within the scope of the invention be included within the appended claims.

I claim:

1. An improved process for pulling a silicon crystal having an elongate axis from a melt contained in a silica crucible to achieve a crystal substantially uniformly doped along said axis with oxygen at a concentration greater than about $1.6 \times 10^{18}$ cm$^{-3}$ wherein the improvement comprises: attaching to the bottom of the interior of said crucible, substantially coaxial with said axis, a toroidal shaped piece of silica; and rotating said crystal during growth to drive oxygen from said toroidal shaped piece of silica to said crystal.

2. The improved process of claim 1 wherein said toroidal shaped piece of silica is formed by bending a silica rod.

3. The improved process of claim 1 wherein said toroidal shaped piece of silica has substantially the same diameter as said crystal.

* * * * *